United States Patent
Bae et al.

(10) Patent No.: US 10,732,504 B2
(45) Date of Patent: Aug. 4, 2020

(54) RESIST UNDERLAYER COMPOSITION, AND METHOD OF FORMING PATTERNS USING THE COMPOSITION

(71) Applicant: SAMSUNG SDI CO., LTD., Yongin-si, Gyeonggi-do (KR)

(72) Inventors: Shinhyo Bae, Suwon-si (KR); Soonhyung Kwon, Suwon-si (KR); Hyeon Park, Suwon-si (KR); Jaeyeol Baek, Suwon-si (KR); Beomjun Joo, Suwon-si (KR); Yoojeong Choi, Suwon-si (KR); Kwen-Woo Han, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/866,809

(22) Filed: Jan. 10, 2018

(65) Prior Publication Data
US 2018/0224744 A1 Aug. 9, 2018

(30) Foreign Application Priority Data
Feb. 3, 2017 (KR) .................. 10-2017-0015750

(51) Int. Cl.
| | |
|---|---|
| G03F 7/11 | (2006.01) |
| C08G 63/20 | (2006.01) |
| G03F 7/09 | (2006.01) |
| H01L 21/308 | (2006.01) |
| C08G 59/42 | (2006.01) |
| G03F 7/039 | (2006.01) |
| C08G 59/24 | (2006.01) |

(52) U.S. Cl.
CPC .............. *G03F 7/11* (2013.01); *C08G 59/245* (2013.01); *C08G 59/4238* (2013.01); *C08G 63/20* (2013.01); *G03F 7/0392* (2013.01); *G03F 7/091* (2013.01); *G03F 7/092* (2013.01); *G03F 7/094* (2013.01); *H01L 21/3081* (2013.01); *H01L 21/3088* (2013.01)

(58) Field of Classification Search
CPC ................... G03F 7/11; C08G 63/20
USPC ...... 430/271.1; 528/176, 194, 211, 265, 296
See application file for complete search history.

(56) References Cited

U.S. PATENT DOCUMENTS

| | | | |
|---|---|---|---|
| 7,470,500 B2 | 12/2008 | Yao et al. | |
| 9,062,162 B2 * | 6/2015 | Rao | C08G 75/045 |
| 9,329,387 B2 * | 5/2016 | Border | G02B 27/0172 |
| 2007/0148974 A1 | 6/2007 | Uh et al. | |
| 2011/0319559 A1 * | 12/2011 | Kania | C08G 75/045 |
| | | | 524/609 |

FOREIGN PATENT DOCUMENTS

| | | |
|---|---|---|
| JP | 2005-321752 A | 11/2005 |
| JP | 4247643 B2 | 4/2009 |
| JP | 4753046 B2 | 8/2011 |
| JP | 5029832 B2 | 9/2012 |
| JP | 2015-025092 A | 2/2015 |
| JP | 5765854 B2 | 6/2015 |
| KR | 10-2007-0002019 A | 1/2007 |
| KR | 10-2013-0077427 A | 7/2013 |
| KR | 10-2014-0055050 A | 5/2014 |
| KR | 10-1590608 B1 | 2/2016 |
| KR | 10-2016-0112847 A | 9/2016 |
| KR | 10-2016-0123950 A | 10/2016 |
| TW | 201346451 A | 11/2013 |
| WO | WO 2005/088398 A1 | 9/2005 |
| WO | WO 2006/040918 A1 | 4/2006 |
| WO | WO 2010-004378 A1 | 1/2010 |
| WO | WO 2015/098525 A1 | 7/2015 |

OTHER PUBLICATIONS

Office Action dated Oct. 12, 2018, of the corresponding Taiwanese Patent Application No. 107102419.

* cited by examiner

*Primary Examiner* — John S Chu
(74) *Attorney, Agent, or Firm* — Lee IP Law, P.C.

(57) ABSTRACT

A resist underlayer composition and a method of forming patterns using the resist underlayer composition, the resist underlayer composition including a polymer including a moiety represented by Chemical Formula 1 and a moiety represented by Chemical Formula 2, and a solvent,

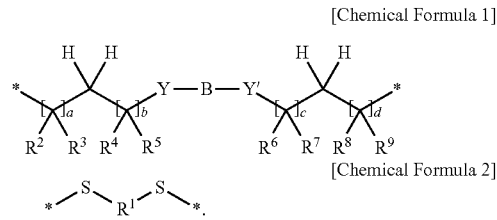

10 Claims, 2 Drawing Sheets

RESIST UNDERLAYER COMPOSITION, AND METHOD OF FORMING PATTERNS USING THE COMPOSITION

CROSS-REFERENCE TO RELATED APPLICATION

Korean Patent Application No. 10-2017-0015750 filed on Feb. 3, 2017, in the Korean Intellectual Property Office, and entitled: "Resist Underlayer Composition, and Method of Forming Patterns Using the Composition," is incorporated by reference herein in its entirety.

BACKGROUND

1. Field

Embodiments relate to a resist underlayer composition and a method of forming a pattern using the same.

2. Description of the Related Art

Recently, a semiconductor industry has developed to an ultra-fine technique having a pattern of several to several tens nanometer size. Such ultrafine technique may require effective lithographic techniques.

One lithographic technique may include coating a photoresist film on a semiconductor substrate and forming a photoresist pattern by exposing and developing the photoresist film. The photoresist is a kind of a photosensitive film used to transfer an image on a substrate.

Exposure performed during formation of the photoresist pattern may be an important factor for obtaining a photoresist image with a high resolution.

SUMMARY

Embodiments are directed to a resist underlayer composition and a method of forming a pattern using the same.

The embodiments may be realized by providing a resist underlayer composition including a polymer including a moiety represented by Chemical Formula 1 and a moiety represented by Chemical Formula 2, and a solvent:

[Chemical Formula 1]

wherein, in Chemical Formula 1, B is a divalent group represented by Chemical Formula Z, oxygen, a substituted or unsubstituted C1 to C30 alkylene group, a substituted or unsubstituted C1 to C30 hetero alkylene group, a substituted or unsubstituted C3 to C30 cycloalkylene group, or a combination thereof, Y and Y' are each independently a single bond, oxygen, a carbonyl, $-(CH_2)O-$, $-(CH_2)S-$, $-(CH_2)NH-$, or a combination thereof, $R^2$ to $R^9$ are each independently hydrogen, a hydroxy group, a halogen, a substituted or unsubstituted vinyl group, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d are each independently an integer ranging from 0 to 100, provided that a sum of a and b is greater than or equal to 1, and a sum of c and d is greater than or equal to 1, and * is a linking point,

[Chemical Formula Z]

wherein, in Chemical Formula Z, A is a substituted or unsubstituted aromatic ring group, a substituted or unsubstituted aliphatic cyclic group, a substituted or unsubstituted heteroaromatic ring group, a substituted or unsubstituted heteroaliphatic cyclic group, or a combination thereof, X is hydrogen, a hydroxy group, a substituted or unsubstituted C1 to C10 alkoxy group, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 heteroaryl group, a substituted or unsubstituted vinyl group, or a combination thereof, and * is a linking point,

[Chemical Formula 2]

wherein in Chemical Formula 2, $R^1$ is a substituted or unsubstituted C1 to C30 alkylene group, a substituted or unsubstituted C1 to C30 hetero alkylene group, a substituted or unsubstituted C3 to C30 cycloalkylene group, a substituted or unsubstituted C6 to C30 arylene group, a substituted or unsubstituted C2 to C30 heteroarylene group, $-((C_mH_{2m})O)_n-$, in which m and n are each independently an integer of 1 to 10, or a combination thereof, and * is a linking point.

B may be a group represented by Chemical Formula Z, and in Chemical Formula Z, X may be a substituted or unsubstituted C1 to C10 alkyl group, a substituted or unsubstituted C2 to C30 alkenyl group, or a substituted or unsubstituted C2 to C30 alkynyl group.

B may be a group represented by Chemical Formula Z, and in Chemical Formula Z, A may be a heteroaromatic ring group or a heteroaliphatic cyclic group.

In Chemical Formula Z, X may be linked with a heteroatom included in A.

A weight average molecular weight of the polymer may be about 1,000 to about 100,000.

The resist underlayer composition may further include a cross-linking agent having two or more cross-linking sites.

The resist underlayer composition may further include a surfactant, a thermal acid generator, and a plasticizer, or a combination thereof.

The embodiments may be realized by providing a method of forming patterns, the method including forming an etching subject layer on a substrate, coating the resist underlayer composition according to an embodiment on the etching subject layer to form a resist underlayer, forming a photoresist pattern on the resist underlayer, and etching the resist underlayer and the etching subject layer sequentially using the photoresist pattern as an etching mask.

Forming the photoresist pattern may include forming a photoresist layer on the resist underlayer, exposing the photoresist layer, and developing the photoresist layer.

After coating the resist underlayer composition, forming the resist underlayer may further include heat-treating the resist underlayer composition at a temperature of about 100° C. to about 500° C.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. The term "or" is not an exclusive term, e.g., "A or B" includes any combination of A, B, and A and B.

In the drawings, the thickness of layers, films, panels, regions, etc., are exaggerated for clarity and like reference numerals designate like elements throughout the specification. It will be understood that when an element such as a layer, a film, a region, or a substrate is referred to as being "on" another element, it can be directly on the other element or intervening elements may also be present. In contrast, when an element is referred to as being "directly on" another element, there are no intervening elements present.

As used herein, when a definition is not otherwise provided, the term 'substituted' may refer to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term 'hetero' refers to one including 1 to 3 heteroatoms selected from N, O, S, and P. For example, a heteroalkyl group would be an alkyl group that includes a heteroatom.

As used herein, when a definition is not otherwise provided, '*' indicates a linking point of a compound or a compound moiety.

Hereinafter, a resist underlayer composition according to an embodiment is described.

A resist underlayer composition according to an embodiment may include a polymer including a moiety represented by Chemical Formula 1 and a moiety represented by Chemical Formula 2, and a solvent.

[Chemical Formula 1]

In Chemical Formula 1,

B may be or may include, e.g., a divalent group represented by Chemical Formula Z, oxygen, a substituted or unsubstituted C1 to C30 alkylene group, a substituted or unsubstituted C1 to C30 hetero alkylene group, a substituted or unsubstituted C3 to C30 cycloalkylene group, or a combination thereof, Y and Y' may each independently be, e.g., a single bond, oxygen, carbonyl. —(CH$_2$)O—, —(CH$_2$)S—, —(CH$_2$)NH—, or a combination thereof.

R$^2$ to R$^9$ may each independently be or include, e.g., hydrogen, a hydroxy group, a halogen, a substituted or unsubstituted vinyl group, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d may each independently be, e.g., an integer ranging from 0 to 100. In an implementation, a sum of a and b may be greater than or equal to 1 and a sum of c and d may be greater than or equal to 1, and

* is a linking point.

[Chemical Formula Z]

In Chemical Formula Z,

A may be or may include, e.g., a substituted or unsubstituted aromatic ring group, a substituted or unsubstituted aliphatic cyclic group, a substituted or unsubstituted hetero aromatic ring group, a substituted or unsubstituted hetero aliphatic cyclic group, or a combination thereof, X may be or may include, e.g., hydrogen, a hydroxy group, a substituted or unsubstituted C1 to C10 alkoxy group, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 heteroaryl group, a substituted or unsubstituted vinyl group, or a combination thereof, and

* is a linking point.

[Chemical Formula 2]

In Chemical Formula 2, $R^1$ may be or may include, e.g., a substituted or unsubstituted C1 to C30 alkylene group, a substituted or unsubstituted C1 to C30 hetero alkylene group, a substituted or unsubstituted C3 to C30 cyclo alkylene group, a substituted or unsubstituted C6 to C30 arylene group, a substituted or unsubstituted C2 to C30 hetero arylene group, $-((C_mH_{2m})O)_n-$ (in which m and n are each independently an integer of 1 to 10), or a combination thereof, and * is a linking point.

In Chemical Formula 1, B may be a group including a ring group represented by Chemical Formula Z, oxygen, a suitable linear group (e.g., a substituted or unsubstituted C1 to C30 alkylene group, a substituted or unsubstituted C1 to C30 hetero alkylene group, or a substituted or unsubstituted C3 to C30 cyclo alkylene group), or a combination thereof.

In an implementation, in Chemical Formula 1, B may include. e.g., a combination of a substituted or unsubstituted C1 to C30 alkylene group and oxygen. In an implementation, in Chemical Formula 1, B may be, e.g., represented by Chemical Formula A.

[Chemical Formula A]

In an implementation, in Chemical Formula 2, $R^1$ may be, e.g., represented by Chemical Formula B.

[Chemical Formula B]

In Chemical Formula B, G and G' may each independently be or include, e.g., a hydroxy group, a substituted or unsubstituted C1 to C10 alkoxy group, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 heteroaryl group, a substituted or unsubstituted vinyl group, or a combination thereof.

m and n may each independently be, e.g., an integer ranging from 1 to 10, and

* is a linking point.

In an implementation, in Chemical Formula 2, G and G' may each be a hydroxy group.

According to an embodiment, the moiety represented by Chemical Formula 1 may include a core (A) that is an aromatic ring group or a hetero aromatic ring group and linear organic groups may extend from, e.g., both, sides of the core.

In an implementation, the aromatic ring group may be e.g., a C6 to C30 aromatic ring group, and the heteroaromatic ring group may be, e.g., a C2 to C30 heteroaromatic ring group.

For example, in Chemical Formula 1, a core represented by B may be, e.g., an aromatic or aliphatic ring group including at least one hetero atom (e.g., may be a heteroaromatic ring group or a heteroaliphatic ring group).

In an implementation, in Chemical Formula Z, a core represented by A may be linked with the functional group represented by X, and X may be, e.g., a substituted or unsubstituted C1 to C30 alkyl group, a substituted or unsubstituted C2 to C30 alkenyl group, or a substituted or unsubstituted C2 to C30 alkynyl group.

In an implementation, in Chemical Formula Z, the functional group represented by X may be linked with the heteroatom of the core (A).

In an implementation, the polymer may be obtained by a chemical reaction of a monomolecule or monomer including two or more vinyl groups (a) and a monomer including two or more thiol groups (b).

In an implementation, the monomer including two or more vinyl groups (a) may include, e.g., a compound of the following Group 1.

[Group 1]

The resist underlayer composition may include a polymer having moieties respectively represented by Chemical Formulae 1 and 2 and thus may have a predetermined refractive index (n) and extinction coefficient (k). Accordingly, when the composition is, e.g., used as a photoresist underlayer material, an etched layer may have excellent absorption with respect to a light source, and thus a light interference effect about the light source may be suppressed.

In addition, the polymer may be stable against an organic solvent and heat, and when a resist underlayer composition including the compound is, e.g., used as a photoresist underlayer material, delamination due to the solvent or heat or generation of a byproduct such as a chemical material and the like during formation of a photoresist pattern and also a thickness loss by a photoresist solvent on top may be minimized. In an implementation, the compound may have excellent solubility and thus may form a resist underlayer having excellent coating uniformity.

In addition, the polymer may be highly hydrophobic and thus may have excellent adherence to a photoresist and may also include sulfur (S) in a main chain and thus may realize a high refractive index and have a fast etch rate.

In an implementation, the polymer may be a copolymer including at least one second moiety derived from another monomer in addition to the aforementioned moiety.

The polymer may have a weight average molecular weight of, e.g., about 1,000 to about 100,000. In an implementation, the polymer may have a weight average molecular weight of, e.g., about 1,000 to about 50,000, or about 1,000 to about 20,000. When the polymer has a weight average molecular weight within the ranges, a resist underlayer composition including the polymer may be optimized by adjusting a carbon content and solubility in a solvent.

When the polymer is used as a material for a resist underlayer, not only may a uniform thin layer be obtained without forming a pin-hole or a void and deteriorating a thickness distribution during a baking process, but also excellent gap-fill and planarization characteristics may be obtained when a lower substrate (or a layer) has a step or is patterned.

The solvent may be a suitable solvent having sufficient solubility or dispersibility for the polymer and may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methyl pyrrolidone, methyl pyrrolidinone, acetylacetone, or ethyl 3-ethoxypropionate.

In an implementation, the polymer may be included in an amount of about 0.1 wt % to about 50 wt %, e.g., about 0.1 wt % to about 30 wt % or about 0.1 wt % to about 15 wt % based on a total weight of the resist underlayer composition. When the polymer is included within the ranges, a thickness, surface roughness, and planarization of the resist underlayer may be controlled.

The resist underlayer composition may further include a cross-linking agent.

The cross-linking agent may be, e.g., a melamine-based, substituted urea-based, or a polymer-based cross-linking agent. In an implementation, it may be a cross-linking agent having at least two cross-linking forming substituents, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, and the like.

The cross-linking agent may be a cross-linking agent having high heat resistance and may be, e.g., a compound including a cross-linking substituent including an aromatic ring (e.g., a benzene ring, or a naphthalene ring) in the molecule. The cross-linking agent may have, e.g., two or more cross-linking sites.

In an implementation, the resist underlayer composition may further include at least one other polymer of, e.g., an acryl resin, an epoxy resin, a novolac resin, a glycoluril resin, or melamine resin, in addition to the polymer including the moieties represented by Chemical Formulae 1 and 2.

The resist underlayer composition may further include an additive of, e.g., a surfactant, a thermal acid generator, a plasticizer, or a combination thereof.

In an implementation, the surfactant may include, e.g., an alkylbenzene sulfonate salt, an alkyl pyridinium salt, polyethylene glycol, or a quaternary ammonium salt.

In an implementation, the thermal acid generator may be, e.g., an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organosulfonic acid alkylester, and the like.

The additive may be present in an amount of about 0.001 parts by weight to about 40 parts by weight, based on 100 parts by weight of the resist underlayer composition. Within the ranges, solubility may be improved while optical properties of the resist underlayer composition are not changed.

According to another embodiment, a resist underlayer manufactured using the resist underlayer composition is provided. The resist underlayer may be a form cured by heat treatment after coating the resist underlayer composition on, e.g., a substrate. The resist underlayer may be, e.g., an anti-reflection coating.

Hereinafter, a method of forming patterns using the resist underlayer composition is described referring to FIGS. 1 to 5.

FIGS. 1 to 5 illustrate cross-sectional views of stages in a method of forming patterns using a resist underlayer composition according to an embodiment.

Figure 1:
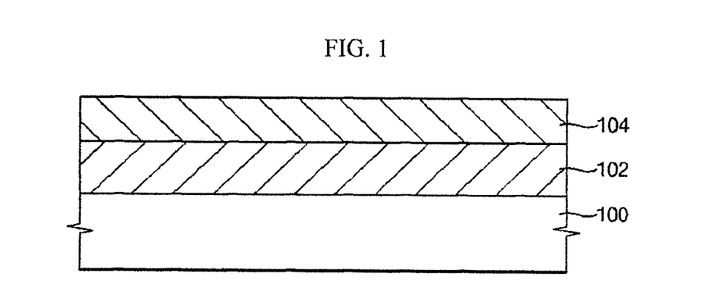
FIGS. 1 to 5 illustrate cross-sectional views of stages in a method of forming patterns using a resist underlayer composition according to an embodiment.

Referring to FIG. 1, a subject for etching may be prepared. The etching subject may be a thin film 102 formed on a semiconductor substrate 100. Hereinafter, the etching subject is the thin film 102. An entire surface of the thin film 102 may be washed to remove impurities and the like remaining thereon. The thin film 102 may be, e.g., a silicon nitride layer, a polysilicon layer, or a silicon oxide layer.

Subsequently, the resist underlayer composition including an acrylate resin including a hydroxy group, a polymer having moieties represented by Chemical Formulae 1 and 2, and a solvent may be spin-coated on the surface of the washed thin film 102.

Then, the coated composition may be dried and baked to form a resist underlayer 104 on the thin film 102. The baking may be performed at about 100° C. to about 500° C., e.g., about 100° C. to about 300° C. The resist underlayer composition is described above in detail and thus a repeated description thereof may be omitted.

Figure 2:
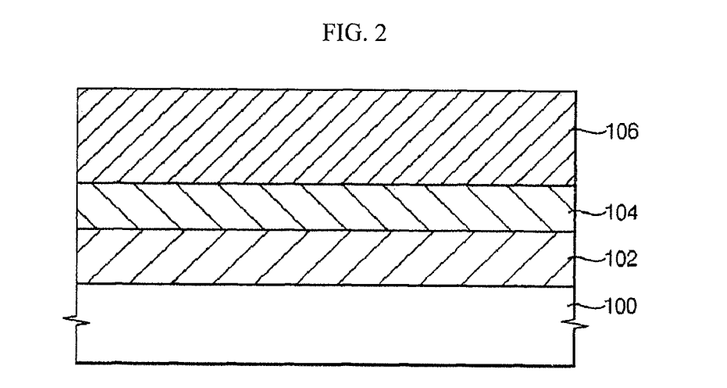

Referring to FIG. 2, a photoresist layer 106 may be formed by coating a photoresist on the resist underlayer 104.

Examples of the photoresist may include a positive-type photoresist containing a naphthoquinonediazide compound and a novolac resin, a chemically-amplified positive photoresist containing an acid generator capable of dissociating acid through exposure, a compound decomposed under presence of the acid and having increased dissolubility in an alkali aqueous solution, and an alkali soluble resin, a chemically-amplified positive-type photoresist containing an alkali-soluble resin capable of applying a resin increasing dissolubility in an alkali aqueous solution, and the like.

Subsequently, the substrate 100 having the photoresist layer 106 thereon may be primarily baked. The primary baking may be performed at about 90° C. to about 120° C.

Figure 3:
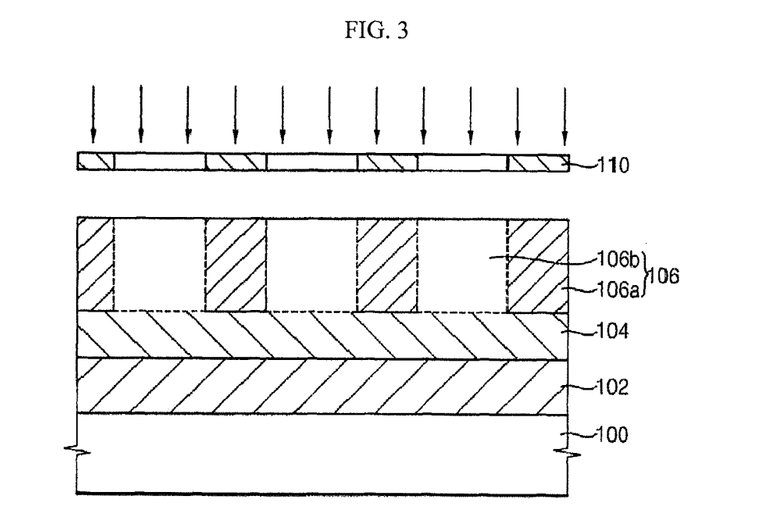

Referring to FIG. 3, the photoresist layer 106 may be selectively exposed.

Exposure of the photoresist layer 106 may be, e.g., performed by positioning an exposure mask having a predetermined pattern on a mask stage of an exposure apparatus and aligning the exposure mask 110 on the photoresist layer 106. Subsequently, a predetermined region of the photoresist layer 106 on the substrate 100 may selectively react with light passing the exposure mask by radiating light into the exposure mask 110. Examples of the light used during the exposure may include an ArF laser (a laser of ArF) having a wavelength of about 193 nm and about 248 nm. EUV (extreme ultraviolet) having a wavelength of about 13.5 nm, and the like.

An exposed region 106b of the photoresist layer 106 may be relatively hydrophilic compared with a non-exposed region 106a of the photoresist layer 106. Accordingly, the exposed region 106b and non-exposed region 106a of the photoresist layer 106 may have different solubility.

Subsequently, the substrate 100 may be secondarily baked. The secondary baking may be performed at about 90° C. to about 150° C. The exposed region 106b of the photoresist layer may become easily soluble in a desired solvent (e.g., developing solution) due to the secondary baking.

Figure 4:
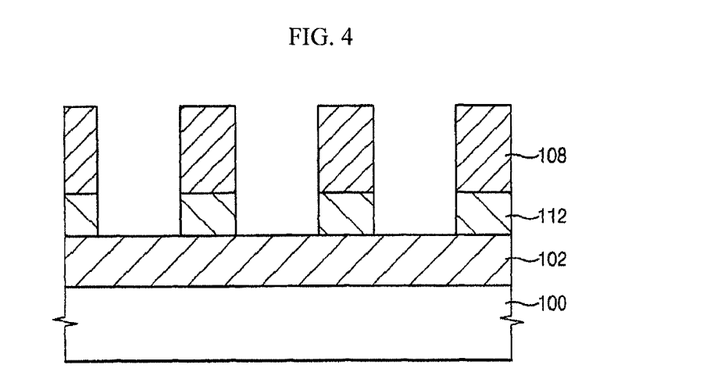

Referring to FIG. 4, the exposed region 106b of the photoresist layer may be dissolved and removed by a developing solution to form a photoresist pattern 108. For example, the exposed region 106b of the photoresist layer may be dissolved and removed by using a developing solution such as tetra-methyl ammonium hydroxide (TMAH) and the like to finish the photoresist pattern 108.

Subsequently, the photoresist pattern 108 may be used as an etching mask to etch the resist underlayer. Through the aforementioned etching, an organic layer pattern 112 may be formed.

The etching may be, e.g., dry etching using etching gas, and the etching gas may be, e.g., $CHF_3$, $CF_4$, $Cl_2$, $BCl_3$, or a mixed gas thereof.

Figure 5:
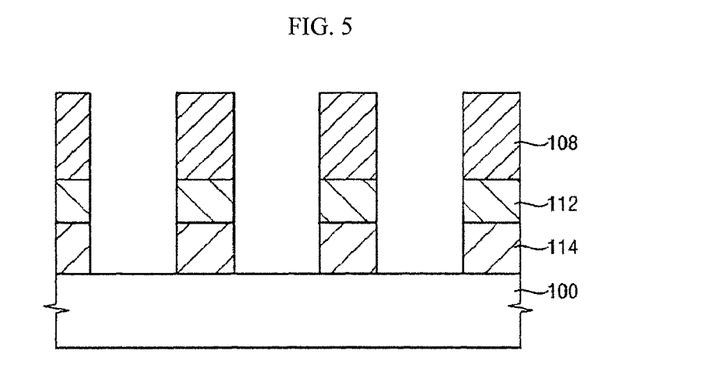

Referring to FIG. 5, the photoresist pattern 108 may be applied as an etching mask to etch the exposed thin film 102. As a result, the thin film may be formed into a thin film pattern 114.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

30 g of 1,3-diallyl-5-(2-hydroxyethyl)isocyanurate, 11.16 g of 1,2-ethane dithiol, 0.389 g of AIBN, and 166 g of dimethyl formamide were put in a 500 ml 2-necked round flask, and a condenser was connected to the flask. After increasing a temperature up to 80° C. and conducting a reaction for 2.5 hours, the obtained reaction solution was cooled down to ambient temperature. Subsequently, the reaction solution was moved to a 1 L wide-mouthed bottle, washed three times with hexane, and then, washed with diethyl ether and purified water in order. The obtained resin in a gum state was completely dissolved in 80 g of THF, and the solution was slowly added to 700 g of toluene that was being stirred. After draining off the solvent therein, remaining solvent was removed by using a vacuum pump to obtain a polymer (Mw=5,100) including a structural unit represented by Chemical Formula 1-1.

[Chemical Formula 1-1]

Synthesis Example 2

14.96 g of triallylcyanurate, 3.81 g of EDT (ethane dithiol), 0.2 g of AIBN, and 25 g of dimethyl formamide were put in a 500 ml 2-necked round flask, and a condenser was connected to the flask. After increasing a temperature up to 80° C. and conducting a reaction for 2.5 hours, the obtained reaction solution was cooled down to ambient temperature. Subsequently, the reaction solution was moved to a 1 L wide-mouthed bottle and washed with purified water and toluene in order. A resin in a gum state was completely dissolved in 80 g of THF, and the solution was slowly added in a dropwise fashion to 700 g of hexane that was being stirred. After draining off the solvent, remaining solvent was removed by using a vacuum pump to obtain a polymer (Mw=17,000) including a structural unit represented by Chemical Formula 1-2.

[Chemcial Formula 1-2]

(wherein, in the chemical formula, m=70 mol % and n=30 mol %)

Synthesis Example 3

A polymer (Mw=2,700) including a structural unit represented by Chemical Formula 1-3 was obtained according to the same method as Synthesis Example 2 except for putting 32.1 g of diallyl ether, 20.7 g of dithiothreitol, 0.5 g of AIBN, and 210 g of DMF in a 500 ml 2-necked round flask.

[Chemical Formula 1-3]

Synthesis Example 4

A polymer (Mw=8.400) including a structural unit represented by Chemical Formula 1-4 was obtained according to the same method as Synthesis Example 2 except for putting 32.1 g of 1,6-hexanediol diacrylate, 20.7 g of dithiothreitol, 0.5 g of AIBN, and 210 g of DMF in a 500 ml 2-necked round flask.

[Chemical Formula 1-4]

Synthesis Example 5

A polymer (Mw=2,900) including a structural unit represented by Chemical Formula 1-5 was obtained according to the same method as Synthesis Example 2 except for putting 30.4 g of triethylene glycol divinyl ether, 20.7 g of dithiothreitol, 0.5 g of AIBN, and 206 g of DMF in a 500 ml 2-necked round flask.

[Chemical Formula 1-5]

Synthesis Example 6

A polymer (Mw=3,200) including a structural unit represented by Chemical Formula 1-6 was obtained according to the same method as Synthesis Example 2 except for putting 29.4 g of 1,4-cyclohexanedimethanol divinyl ether, 20.7 g of dithiothreitol, 0.5 g of AIBN, and 206 g of DMF in a 500 ml 2-necked round flask.

[Chemical Formula 1-6]

Synthesis Example 7

A polymer (Mw=4,500) including a structural unit represented by Chemical Formula 1-7 was obtained according to the same method as Synthesis Example 2 except for putting 23.7 g of di(ethylene glycol) divinyl ether, 20.7 g of dithiothreitol, 0.5 g of AIBN, and 206 g of DMF in a 500 ml 2-necked round flask.

[Chemical Formula 1-7]

Synthesis Example 8

A polymer (Mw=4,200) including a structural unit represented by Chemical Formula 1-8 was obtained according to the same method as Synthesis Example 2 except for putting 23.7 g of diallyl terephthalate, 20.4 g of dithiothreitol, 0.5 g of AIBN, and 206 g of DMF in a 500 ml 2-necked round flask.

[Chemical Formula 1-8]

Comparative Synthesis Example 1

40 g of methyl methacrylate, 52.1 g of 2-hydroxyacrylate, 70.4 g of benzyl acrylate, 2 g of AIBN, and 306 g of dioxane were put in a 500 ml 2-necked round flask, and a condenser was connected to the flask. After increasing a temperature up to 80° C. and conducting a reaction for 2.5 hours, the obtained reaction solution was cooled down to ambient temperature. The reaction solution was moved to a 3 L wide-mouthed bottle and washed with hexane. The obtained resin was dried in a 30° C. vacuum oven to remove the remaining solvent and obtain a polymer (Mw=12,000) including a structural unit represented by Chemical Formula 2'.

[Chemical Formula 2']

Preparation of Resist Underlayer Composition

Examples 1 to 8 and Comparative Example 1

The polymer of Synthesis Example 1 and PD1174 (a hardener. TCI, 15 parts by weight based on 100 parts by weight of the polymer) and pyridinium p-toluenesulfonate (1 part by weight based on 100 parts by weight of the polymer) were dissolved in a mixed solvent of propylene glycol monomethylether and ethyl lactate (a mixing weight ratio=1:1), and the solution was stirred for 6 hours to prepare a resist underlayer composition.

An amount of the mixed solvent was determined where the polymer was included in a solid content of 1 wt % based on the entire weight of the resist underlayer composition.

Examples 2 to 8

Each of resist underlayer compositions were prepared according to the same method as Example 1 except for using each polymer according to Synthesis Examples 2 to 8.

Comparative Example 1

A resist underlayer composition was prepared according to the same method as Example 1 except for using the polymer according to Comparative Synthesis Example 1.

Evaluation Optical Properties

The compositions according to Examples 1 to 8 and Comparative Example 1 were respectively taken in 2 mL amounts, applied on a 4 inch wafer, and spin-coated at 1,500 rpm for 20 seconds by using a spin coater (Mikasa Co., Ltd.). Subsequently, the coated compositions were cured at 210° C. for 90 seconds to form each 30 nm-thick thin film. A refractive index (n) and an extinction coefficient (k) of each thin film were measured under a condition of 300 A by using VASE Elliposmeters (J. A. Woollam Co.).

The results are shown in Table 1.

TABLE 1

|  | Polymers | n | k |
|---|---|---|---|
| Example 1 | Chemical Formula 1-1 | 2.01 | 0.35 |
| Example 2 | Chemical Formula 1-2 | 1.98 | 0.36 |
| Example 3 | Chemical Formula 1-3 | 1.78 | 0.25 |
| Example 4 | Chemical Formula 1-4 | 1.81 | 0.26 |
| Example 5 | Chemical Formula 1-5 | 1.70 | 0.23 |
| Example 6 | Chemical Formula 1-6 | 1.74 | 0.24 |
| Example 7 | Chemical Formula 1-7 | 1.77 | 0.26 |
| Example 8 | Chemical Formula 1-8 | 1.79 | 0.27 |
| Comparative Example 1 | Chemical Formula 2' | 1.65 | 0.21 |

Referring to Table 1, resist underlayers manufactured by using the compositions respectively including the polymer having a structural unit represented by Chemical Formula 1 (Examples 1 to 8) showed an excellent refractive index (n) and extinction coefficient (k) and thus effectively absorbed reflective light during formation of a photoresist pattern using light of a short wavelength and provided a pattern having a satisfactory shape.

By way of summation and review, exposure of a photoresist may be performed by using an activated radiation, which may be reflected and could restrict or reduce resolution of an image patterned in the photoresist layer. When the radiation is reflected on the interface between the substrate and the photoresist layer or on an interlayer hardmask is scattered into a photoresist region, a photoresist line width may become non-uniform and pattern formality may be obstructed.

In addition, a photoresist underlayer composition may absorb the reflected radiation and simultaneously, may have high etch selectivity with the photoresist and may exhibit chemical resistance against a solvent in a subsequent process after thermal curing and excellent adherence to the photoresist to help patterning the photoresist.

In order to help decrease the reflected radiation, an attempt to absorb light passing the photoresist and simultaneously improve etch selectivity, chemical resistance, and adherence to the photoresist has been made by disposing an organic layer, e.g., a resist underlayer, between a substrate and a photoresist layer.

The embodiments may provide a resist underlayer composition having planarization characteristics and a fast etch rate and simultaneously absorption properties in a predetermined wavelength.

The embodiments may provide a photoresist underlayer composition for an underlayer formed between a semiconductor substrate and a photoresist layer and a method of forming a photoresist pattern using the underlayer.

Accordingly, a resist underlayer composition having absorption properties in a predetermined wavelength and simultaneously excellent coating properties may be provided.

| <Description of Symbols> | |
|---|---|
| 100: substrate | 102: thin film |
| 104: resist underlayer | 106: photoresist layer |
| 108: photoresist pattern | 110: mask |
| 112: organic layer pattern | 114: thin film pattern |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A resist underlayer composition, comprising:
a polymer including a moiety represented by Chemical Formula 1 and a moiety represented by Chemical Formula 2, and
a solvent:

[Chemical Formula 1]

wherein, in Chemical Formula 1,

B is a divalent group represented by Chemical Formula Z, oxygen, a substituted or unsubstituted C1 to C30 alkylene group, a substituted or unsubstituted C1 to C30 hetero alkylene group, a substituted or unsubstituted C3 to C30 cycloalkylene group, or a combination thereof, Y and Y' are each independently a single bond, oxygen, a carbonyl, —(CH$_2$)O—, —(CH$_2$)S—, —(CH$_2$)NH—, or a combination thereof, R$^2$ to R$^9$ are each independently hydrogen, a hydroxy group, a halogen, a substituted or unsubstituted vinyl group, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d are each independently an integer ranging from 0 to 100, provided that a sum of a and b is greater than or equal to 1, and a sum of c and d is greater than or equal to 1, and

* is a linking point,

[Chemical Formula Z]

wherein, in Chemical Formula Z,

A is a substituted or unsubstituted aromatic ring group, a substituted or unsubstituted aliphatic cyclic group, a substituted or unsubstituted heteroaromatic ring group, a substituted or unsubstituted heteroaliphatic cyclic group, or a combination thereof, X is hydrogen, a hydroxy group, a substituted or unsubstituted C1 to C10 alkoxy group, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 heteroaryl group, a substituted or unsubstituted vinyl group, or a combination thereof, and

* is a linking point,

[Chemical Formula 2]

wherein in Chemical Formula 2,

R$^1$ is a substituted or unsubstituted C3 to C30 cycloalkylene group, a substituted or unsubstituted C6 to C30 arylene group, a group represented by Chemical Formula B, or a combination thereof, and

* is a linking point,

[Chemical Formula B]

wherein in Chemical Formula B,

G and G' are each independently a hydroxy group, a substituted or unsubstituted C1 to C10 alkoxy group, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 heteroaryl group, a substituted or unsubstituted vinyl group, or a combination thereof, m and n are each independently an integer ranging from 1 to 10, and

* is a linking point.

2. The resist underlayer composition as claimed in claim 1, wherein:
B is a group represented by Chemical Formula Z, and
in Chemical Formula Z, X is a substituted or unsubstituted C1 to C10 alkyl group, a substituted or unsubstituted C2 to C30 alkenyl group, or a substituted or unsubstituted C2 to C30 alkynyl group.

3. The resist underlayer composition as claimed in claim 1, wherein:
B is a group represented by Chemical Formula Z, and
in Chemical Formula Z, A is a heteroaromatic ring group or a heteroaliphatic cyclic group.

4. The resist underlayer composition as claimed in claim 3, wherein in Chemical Formula Z, X is linked with a heteroatom included in A.

5. The resist underlayer composition as claimed in claim 1, wherein a weight average molecular weight of the polymer is about 1,000 to about 100,000.

6. The resist underlayer composition as claimed in claim 1, further comprising a cross-linking agent having two or more cross-linking sites.

7. The resist underlayer composition as claimed in claim 1, further comprising a surfactant, a thermal acid generator, and a plasticizer, or a combination thereof.

8. A method of forming patterns, the method comprising:
forming an etching subject layer on a substrate,
coating the resist underlayer composition as claimed in claim 1 on the etching subject layer to form a resist underlayer,
forming a photoresist pattern on the resist underlayer, and
etching the resist underlayer and the etching subject layer sequentially using the photoresist pattern as an etching mask.

9. The method as claimed in claim 8, wherein forming the photoresist pattern includes:
forming a photoresist layer on the resist underlayer,
exposing the photoresist layer, and
developing the photoresist layer.

10. The method as claimed in claim 8, wherein after coating the resist underlayer composition, forming the resist underlayer further includes heat-treating the resist underlayer composition at a temperature of about 100° C. to about 500° C.

* * * * *